(12) United States Patent
Cowley et al.

(10) Patent No.: US 11,671,724 B2
(45) Date of Patent: Jun. 6, 2023

(54) SYSTEMS AND METHODS FOR MITIGATING GLOBAL EVENT POWER SURGE IN IMAGE SENSORS

(71) Applicant: SEMICONDUCTOR COMPONENTS INDUSTRIES, LLC, Phoenix, AZ (US)

(72) Inventors: Nicholas Paul Cowley, Wroughton (GB); Andrew David Talbot, Chieveley (GB)

(73) Assignee: SEMICONDUCTOR COMPONENTS INDUSTRIES, LLC, Scottsdale, AZ (US)

( * ) Notice: Subject to any disclaimer, the term of this patent is extended or adjusted under 35 U.S.C. 154(b) by 180 days.

(21) Appl. No.: 17/249,583

(22) Filed: Mar. 5, 2021

(65) Prior Publication Data
US 2022/0286640 A1 Sep. 8, 2022

(51) Int. Cl.
*H04N 25/71* (2023.01)
*H01L 27/146* (2006.01)
*H01L 27/148* (2006.01)
*H04N 25/533* (2023.01)

(52) U.S. Cl.
CPC ..... *H04N 25/745* (2023.01); *H01L 27/14612* (2013.01); *H01L 27/14643* (2013.01); *H01L 27/14856* (2013.01); *H04N 25/533* (2023.01)

(58) Field of Classification Search
CPC .. H04N 5/3765; H04N 5/3535; H04N 25/745; H04N 25/533; H01L 27/14612; H01L 27/14643; H01L 27/14856
See application file for complete search history.

(56) References Cited

U.S. PATENT DOCUMENTS

| 8,135,103 B1 | 3/2012 | Courcy et al. | |
| 2013/0075590 A1* | 3/2013 | Compton | H04N 5/3532 250/208.1 |
| 2014/0061435 A1* | 3/2014 | Estrada | H04N 5/353 327/261 |

(Continued)

OTHER PUBLICATIONS

"Next Generation Design Tools Outlook," NextPCB, Jul. 12, 2018; Retrieved from the Internet: <https://www.nextpcb.com/blog/next-generation-design-tools-outlook> on Dec. 6, 2020.

*Primary Examiner* — Shahbaz Nazrul
(74) *Attorney, Agent, or Firm* — Treyz Law Group, P.C.; Tianyi He (57) ABSTRACT

An image sensor may include a pixel array, row control circuitry, and column readout circuitry. The row control circuitry may operate the pixel array in a global shutter mode of operation. In particular, timing control circuitry may provide global timing clock signals associated with a global photodiode reset event and a global photodiode charge transfer event to row driver circuitry providing control signals to each row in the array. Each driver circuitry may include a time delay circuit that delays the global timing clock signal by different amounts across the rows. Therefore, these global events may be offset on a per-row or per-row group basis, thereby mitigating power surges associated with global events. Further, by offsetting the global photodiode reset and charge transfer events using the same delay for a given row, the same global integration time may be preserved across different rows.

20 Claims, 7 Drawing Sheets

(56) References Cited

U.S. PATENT DOCUMENTS

2017/0155863 A1* 6/2017 Shikina .................. H04N 5/369
2017/0338262 A1* 11/2017 Hirata ............... H01L 27/14609
2019/0288019 A1 9/2019 Lai et al.
2021/0051286 A1* 2/2021 Kasugai ............ H01L 27/14831
2021/0377484 A1* 12/2021 Bojja ................. H04N 5/37452

* cited by examiner

SYSTEMS AND METHODS FOR MITIGATING GLOBAL EVENT POWER SURGE IN IMAGE SENSORS

BACKGROUND

This relates generally to imaging systems and more specifically to image sensors operable using global signals.

A typical image sensor includes active image sensor pixels that generate image signals in response to incident light. Row control circuitry can provide control signals to operate the image sensor pixels. In some modes of operation, the image sensor pixels are operated in a global manner (e.g., in a global shutter mode of operation). As an example, photodiodes in all pixels may be globally (e.g., simultaneously) reset to begin an integration time period based on a global control signal.

However, these global events (e.g., a global reset operation, global charge transfer operation, etc.), especially in large image sensor pixel arrays, often cause large current/power surges in supply lines and grounding lines. This is at least because the same supply lines and grounding lines are shared by the image sensor pixels and their corresponding row drivers, and are simultaneously utilized (at the global event) by all of the corresponding row drivers. These corresponding row drivers therefore cumulatively draw a large amount of current from shared lines in a short amount of time (e.g., at the control signal rising or falling edges, which are aligned to each other for the global event). These current/power surges can undesirably lead to variations in performance such as pixel location dependent supply modulation. While these adverse effects may be mitigated using more complex power delivery networks, this undesirably increases power delivery complexity. As such, it may be desirable to mitigate these current surge issues to provide satisfactory sensor performance, without complicating the power delivery network.

It is within this context that the embodiments herein arise.

DETAILED DESCRIPTION

Electronic devices such as digital cameras, computers, cellular telephones, and other electronic devices may include image sensors that gather incoming light to capture an image (e.g., an image frame). The image sensors may include arrays of image sensor pixels. The pixels in the image sensors may include photosensitive elements such as photosensitive elements that convert the incoming light into image signals. Image sensors may have any number of pixels (e.g., hundreds or thousands or more). A typical image sensor may, for example, have hundreds of thousands or millions of pixels (e.g., megapixels). Image sensors may include control circuitry such as circuitry for operating the image pixels and readout circuitry for reading out image signals corresponding to the electric charge generated by the photosensitive elements.

Figure 1:
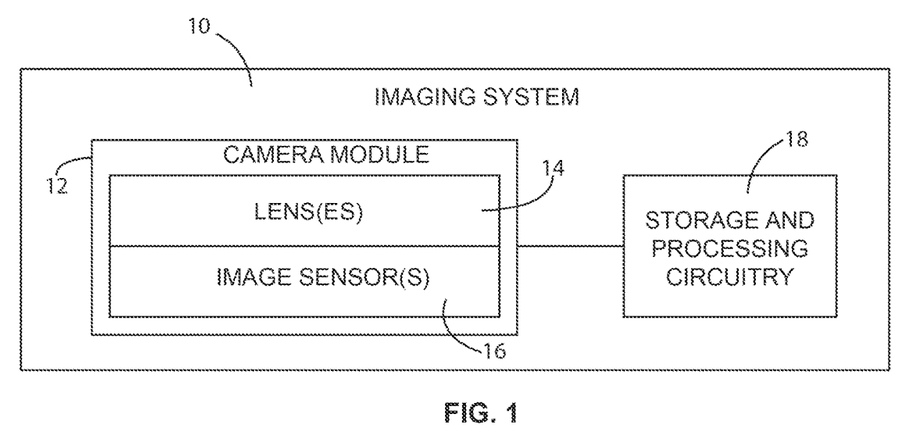
FIG. 1 is a diagram of an illustrative imaging system having an image sensor and processing circuitry in accordance with some embodiments.

FIG. 1 is a diagram of an illustrative imaging system such as an electronic device that uses an image sensor to capture images. Imaging system 10 of FIG. 1 may be a camera, a cellular telephone, a tablet computer, a webcam, a video camera, a video surveillance system, an automotive imaging system, a video gaming system with imaging capabilities, an augmented reality and/or virtual reality system, an unmanned aerial vehicle system (e.g., a drone), an industrial system, or any other desired imaging system or device that captures digital image data. Camera module 12 (sometimes referred to as an imaging module) may be used to convert incoming light into digital image data. Camera module 12 may include one or more lenses 14 and one or more corresponding image sensors 16. During image capture operations, light from a scene may be focused onto image sensor 16 by lenses 14. Image sensor 16 may include analog-to-digital converter (ADC) circuitry for converting analog pixel signals into corresponding digital image data that is provided to storage and processing circuitry 18.

Storage and processing circuitry 18 may include one or more integrated circuits (e.g., image processing circuits, microprocessors, storage devices such as random-access memory and non-volatile memory, etc.) and may be implemented using components that are separate from the camera module and/or that form part of the camera module. When storage and processing circuitry 18 is included on different integrated circuits than those of image sensors 16, the integrated circuits with circuitry 18 may be vertically stacked or packaged with respect to the integrated circuits with image sensors 16. Image data that has been captured by the camera module may be processed and stored using processing circuitry 18 (e.g., using an image processing engine on processing circuitry 18, using an imaging mode selection engine on processing circuitry 18, etc.). Processed image data may, if desired, be provided to external equipment (e.g., a computer, an external display, or other devices) using wired and/or wireless communications paths coupled to processing circuitry 18.

Figure 2:
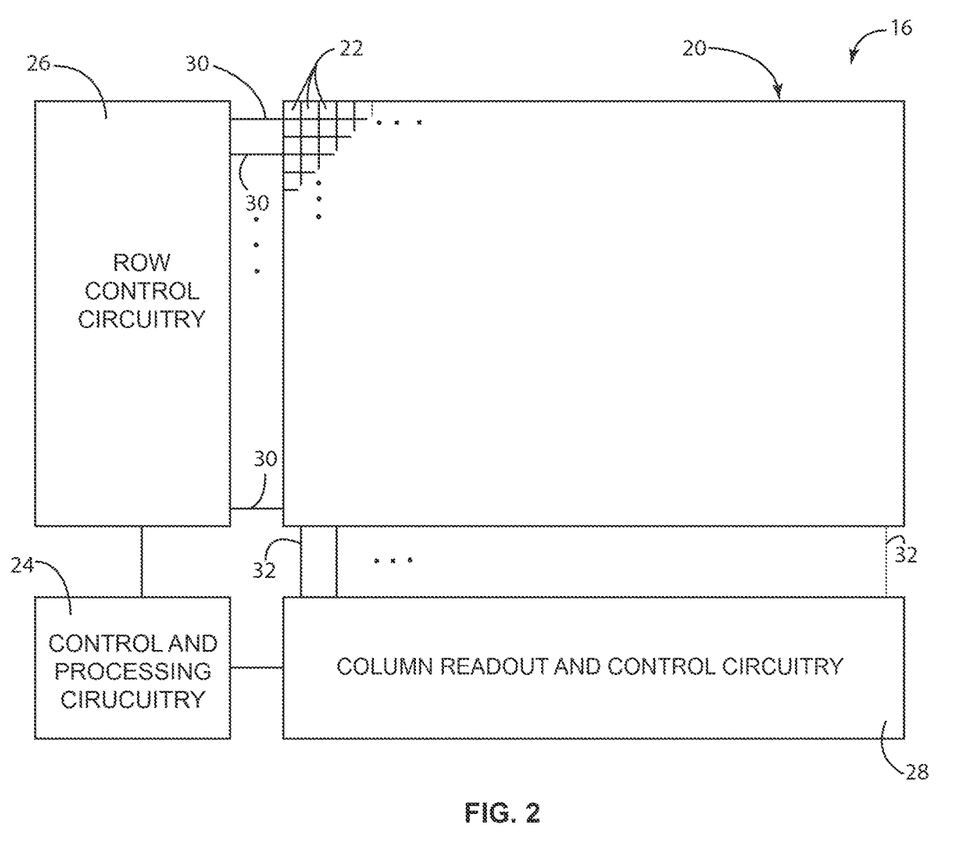
FIG. 2 is a diagram of an illustrative image sensor having a pixel array and corresponding control and readout circuitry in accordance with some embodiments.

As shown in FIG. 2, image sensor 16 may include pixel array 20 containing image sensor pixels 22 (sometimes referred to herein as image pixels or pixels) arranged in rows and columns, and may include control and processing circuitry 24. Array 20 may contain, for example, hundreds or thousands of rows and columns of image sensor pixels 22. Control circuitry 24 may be coupled to row control circuitry 26 and column readout and control circuitry 28 (sometimes referred to herein as column readout circuitry or column control circuitry). Row control circuitry 26 may receive row addresses and control signals from control circuitry 24 and supply corresponding row control signals such as reset, anti-blooming, row select, charge transfer, dual conversion gain mode, and readout control signals to rows of pixels 22 over row control paths 30. While only one path 30 is shown for each row of pixels 22, this is merely illustrative. Any corresponding number of paths 30 may be coupled to each row of pixels 22.

One or more conductive lines such as column lines 32 may be coupled to each column of pixels 22 in array 20. Column lines 32 may be used for reading out (reset level or image level) signals from pixels 22 and for supplying bias signals (e.g., bias currents or bias voltages) to pixels 22. If desired, during pixel readout operations, a pixel row in array 20 may be selected using row control circuitry 26 and a signal generated by each corresponding image pixel 22 in that pixel row can be read out along a respective column line 32.

Column readout circuitry 28 may receive signals (e.g., analog pixel values generated by pixels 22) over column lines 32. Column readout circuitry 28 may include memory circuitry for temporarily storing calibration signals (e.g., reset level signals, reference level signals) and/or image signals (e.g., image level signals) read out from array 20, amplifier circuitry or a multiplier circuit, analog to digital converter (ADC) circuitry, bias circuitry, latch circuitry for selectively enabling or disabling the column circuitry, or other circuitry that is coupled to one or more columns of pixels in array 20 for operating pixels 22 and for reading out signals from pixels 22. After reading out and/or processing signals from pixel 22, readout circuitry 28 may supply the readout pixel data to control and processing circuitry 24 and/or processor 18 (FIG. 1) for further processing and/or storage.

Pixel array 20 may be provided with a filter array having multiple (color) filter elements (each corresponding to a respective pixel) which allows a single image sensor to sample light of different colors or sets of wavelengths.

As an example, image sensor pixels 22 may be provided with a color filter array having red, green, and blue filter elements, which allows a single image sensor to sample red, green, and blue (RGB) light using corresponding red, green, and blue image sensor pixels arranged in a Bayer mosaic pattern. In other suitable examples, the green pixels in a Bayer pattern may be replaced by broadband image pixels having broadband color filter elements (e.g., clear color filter elements, yellow color filter elements, etc.), or one of the green pixels in a Bayer pattern may be replaced by infrared (IR) image pixels formed under IR color filter elements and/or the remaining red, green, and blue image pixels may also be sensitive to IR light (e.g., may be formed under filter elements that pass IR light in addition to light of their respective colors). These examples are merely illustrative and, in general, filter elements of any desired color and/or wavelength and in any desired pattern may be formed over any desired number of image pixels 22.

Additionally, pixel array 20 may also be provided with a microlens array having multiple microlenses of one or more types. Each microlens may be configured to focus light onto a corresponding photosensitive element in a pixel. If desired, microlenses may be omitted for one or more photosensitive elements.

Figure 3:
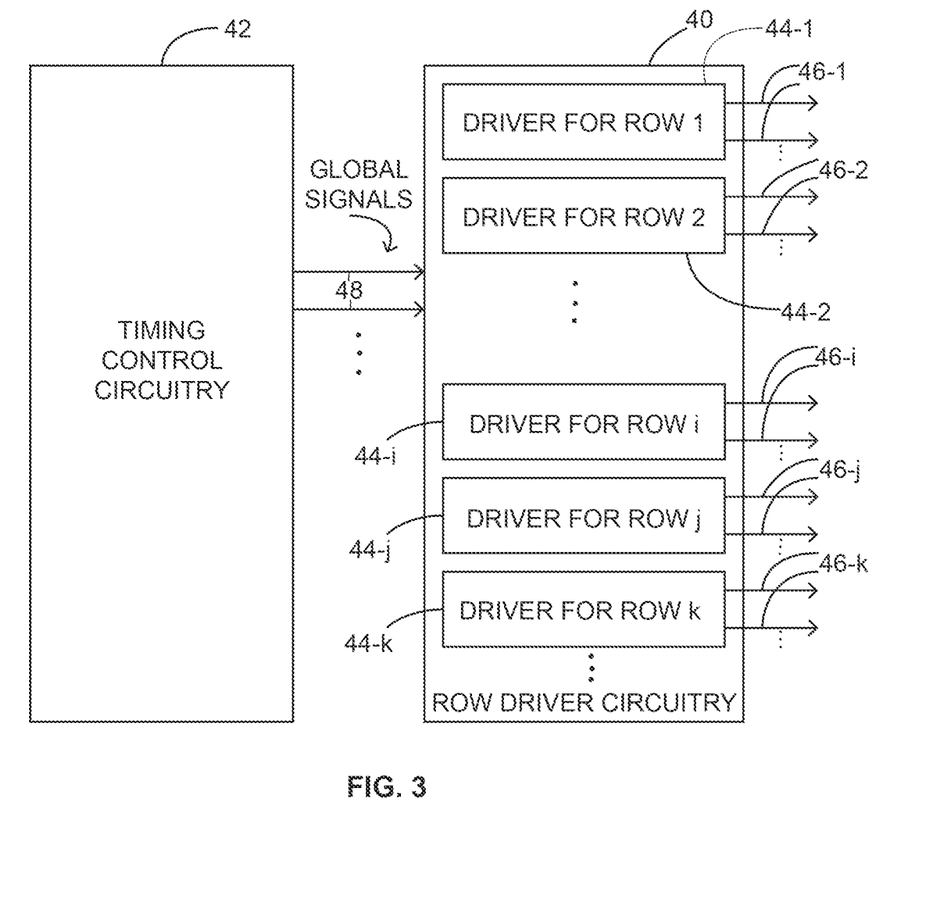
FIG. 3 is a diagram of illustrative row driver circuitry operable using one or more global signals in accordance with some embodiments.

As described in connection with FIG. 2, row control circuitry 26 may operate to provide control signals for sets of pixels (e.g., rows of pixels 22) over one or more corresponding lines (e.g., row control lines 30 in FIG. 2). FIG. 3 is a diagram of illustrative driver circuitry used to provide (control) signals to sets of pixels organized in rows or in other suitable manners. As shown in FIG. 3, row driver circuitry 40 (e.g., in row control circuitry 26 in FIG. 2) or generally pixel driver circuitry 40 is coupled to timing control circuitry 42 (sometimes referred to herein as timing generator 42 or timing generation circuitry 42). Timing control circuitry 42 may be implemented as a part of row control circuitry 26 in FIG. 2 (or if desired, as part of control and processing circuitry 24 in FIG. 2).

In the example of FIG. 3, row driver circuitry 42 includes corresponding driver circuitry 44 for each row of pixels 22 (FIG. 2). Each driver circuitry 44 may provide control signals or other signals to each transistor and/or adjustable component in pixels 22 of that row. As an illustrative example, driver circuitry 44-1 may be coupled to each pixel in a first row of pixels and may provide the same set of control signals and other signals over respective row paths 46-1 to transistors and/or adjustable components of each pixel in the first row of pixels. Other driver circuitry 44 (e.g., driver circuitry 44-2, 44-i, 44-j, 44-k, etc.) may be coupled to and provide signals to that pixel row in a manner analogous to that described above in connection with driver circuitry 44-1.

While the example of FIG. 3 shows five driver circuitry 44 for five pixel rows, row driver circuitry 40 may include any suitable number of driver circuitry 44 for any number of pixel rows (e.g., corresponding to a number of pixel rows in array 20 in FIG. 2, corresponding to a number of active pixel rows, inactive pixel rows, optically black pixels, and/or other pixel rows, etc.).

As examples, each driver circuitry 44 may supply pixels 22 with control signals such as a reset control signal for a reset transistor, an anti-blooming signal for an anti-blooming transistor, a row select control signal for a row select transistor, one or more charge transfer control signals for corresponding charge transfer transistors, one or more dual conversion gain control signals for dual conversion gain transistors, or any other suitable control signals, and/or may supply pixels 22 with other signals such as one or more bias voltage signals (e.g., to supply one or more variable voltage signals to components) or generally any other suitable signals. To properly generate and provide (e.g., assert and deassert) these signals to pixels, driver circuitry 44 (row driver circuitry 40) may be coupled to timing control circuitry 42 via paths 48. Timing control circuitry 42 may provide various timing control signals for different pixel operations (e.g., for pixel photodiode reset, for pixel photodiode charge transfer, etc.) according to a timing schedule of desired operations.

In one illustrative configuration, timing control circuitry 42 may provide one or more global timing control signals (e.g., that simultaneously control or provide shared control of all or almost all pixels 22) to row driver circuitry 40. Based on a global timing control signal, each driver circuitry 44 may provide a corresponding row-wise control signal. These row-wise control signals may be synchronized with each other based on the global timing control signal.

As an illustrative example, image sensor 16 (FIG. 2) may be an image sensor operable in a global shutter mode of operation (e.g., image sensor array 20 may receive control signals from row control circuitry 26 that operate image sensor array 20 in a global shutter mode of operation). Consequently, pixels 22 in image sensor array 20 may be global shutter pixels.

Figure 4:
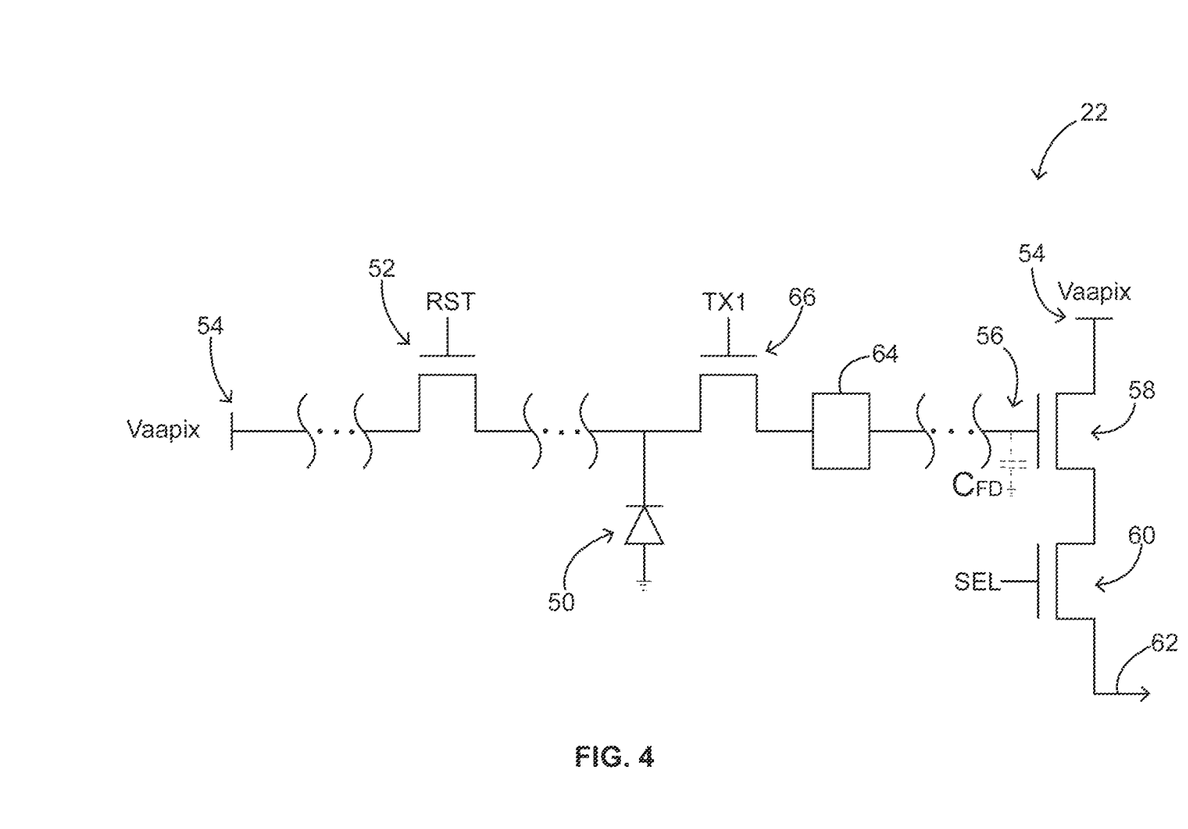
FIG. 4 is a diagram of an illustrative image sensor pixel operable in a global shutter mode of operation in accordance with some embodiments.

FIG. 4 shows an illustrative image sensor pixel having elements that may enable the image sensor pixel to be operated in a global shutter mode of operation. Pixel 22 in FIG. 4 may be used to implement pixels 22 across array 20 in FIG. 2. As shown in FIG. 4, pixel 22 includes a photosensitive element such as photodiode 50 that receives incident light over a period of time (e.g., an integration time period) and generates (electric) charge based on the incident light. Pixel 22 may include a transistor such as reset transistor 52 that couples photodiode 50 to a voltage source such as voltage terminal 54 supplying a pixel supply voltage (sometimes referred to as a reset level voltage). In particular, the coupling between photodiode 50 and voltage terminal 54 using transistor 52 may be direct (without any other intervening transistors or other adjustable elements) or indirect (with one or more additional transistors between photodiode 50 and voltage terminal 54). Transistor 52 (and the one or more additional transistors, if any) may be activated by asserting control signal RST (and corresponding control signals for the one or more additional transistors) to connect photodiode 50 to voltage terminal 54 to reset photodiode 50 to a reset level voltage.

As shown in FIG. 4, pixel 22 also includes a floating diffusion region 56 having an associated charge storage capacity (indicated by capacitance $C_{FD}$). One or more charge transfer transistors (e.g., transistor 66) may couple photodiode 50 to floating diffusion region 56. One or more of these transfer transistors may be activated to transfer photodiode-generated charge to floating diffusion region 56 for pixel readout operations (e.g., reading out image level signals corresponding to the charge at floating diffusion region 56 from pixel 22). If desired, a reset transistor (e.g., reset transistor 52 or another reset transistor) may couple and connect floating diffusion region 56 to a voltage terminal supplying a pixel supply voltage to reset floating diffusion region 56 to a reset level voltage (e.g., the pixel supply voltage). The reset level charge at floating diffusion region 56 may be read out as reset level signals.

To enable the pixel readout operations, pixel 22 may include a source follower transistor 58 and a row select transistor 60. Source follower transistor 58 may have a gate terminal coupled to floating diffusion region 56, a first source-drain terminal (e.g., one of a source or drain terminal) coupled to a voltage source (e.g., voltage terminal 54 supplying a pixel supply voltage), and a second source-drain terminal (e.g., the other one of the source or drain terminal) coupled to row select transistor 60. When control signal SEL for row select transistor 60 is asserted (e.g., during a pixel row readout operation when reset and/or image level signals from pixels in a given row that includes pixel 22 are being read out), a pixel output signal may be passed onto pixel output path 62 (e.g., coupled to column line 32 in FIG. 2). The pixel output signal may be an output signal having a magnitude that is proportional to the amount of charge at floating diffusion region 56 (e.g., may represent a reset level signal when the amount of charge at floating diffusion region 56 is associated with reset level charge or may represent an image level signal when the amount of charge at floating diffusion region 56 is associated with image level or photodiode-generated charge).

To efficiently enable a global shutter mode of operation (e.g., with reduced noise), pixel 22 may include one or more local charge storage regions (sometimes referred to as charge storage structures) coupled between photodiode 50 and floating diffusion region 56 (e.g., in series and/or in parallel one or more corresponding paths between photodiode 50 and floating diffusion region 56). In particular, as shown in FIG. 3, pixel 22 includes local charge storage region 64 coupled between photodiode 50 and floating diffusion region 56. Charge storage region 64 may be a storage gate, a storage diode, or any other suitable charge storage structure. Transistor 66 may couple photodiode 50 to charge storage region 64. When control signal TX1 is asserted to activate transistor 66, photodiode-generated charge may be transferred from photodiode 50 to charge storage region 64 prior to being transferred to floating diffusion region 56 for a readout operation. If desired, charge storage region 64 may be omitted. While not explicitly shown in FIG. 4 in order to not obscure the present embodiments, one or more additional elements such as transistors may couple and be activated to connect charge storage region 64 to floating diffusion region 56.

The configuration of pixel 22 in FIG. 4 is merely illustrative. If desired, pixel 22 may include any additional elements such as transistors, photosensitive elements, (conversion gain) capacitors, etc., or may omit or replace any suitable elements in pixel 22.

Referring back to FIG. 3 and in connection with a global shutter mode of operation using the illustrative pixel configuration of FIG. 4, timing control circuitry 42 may provide a global RST photodiode reset timing control signal to reset photodiodes of pixels 22 across array 20 (FIG. 2) in a global manner and may provide a global TX1 charge transfer timing control signal to transfer photodiode-generated charge to local charge storage regions of pixels 22 across array 20 in a global manner. The time period between the assertion of the global RST timing control signal and the assertion of the global TX1 timing control signal may be the global integration time. In particular, row driver circuitry 40 may distribute each of the received global timing control signals from timing control circuitry 42 to driver circuitry 44 for each of the pixel rows. In such a manner, an assertion in the global timing control signal for a given control signal may generate or result in a coordinated (e.g., near simultaneous) assertion in the corresponding given control signal across the different pixel rows using respective driver circuitry 44 (e.g., associated with a global event).

Figure 5:
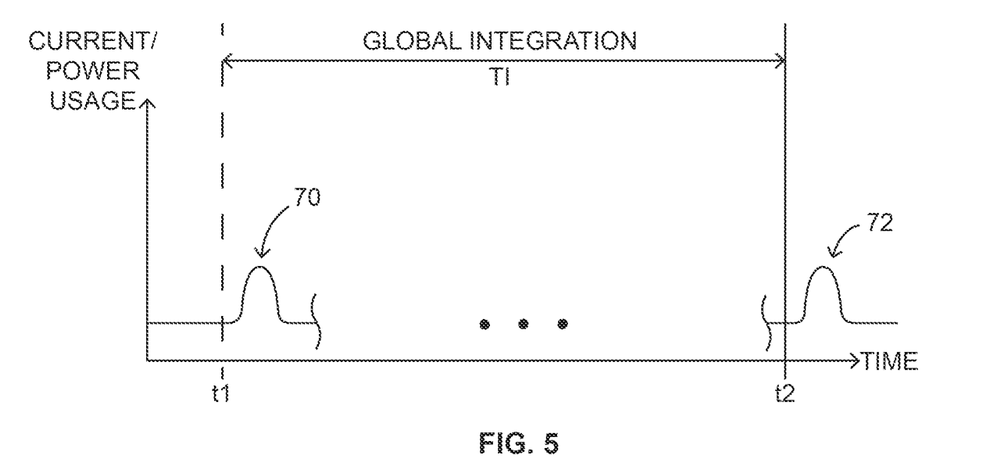
FIG. 5 is an illustrative graph showing power usage with respect to a global integration time period in accordance with some embodiments.

However, because the coordinated assertion of a control signal (e.g., associated with a global event) across the array may collectively draw a large amount of current (power) at the shared supply and/or ground lines coupled to each driver circuitry 44 in a relatively short amount of time, this can undesirably cause a current/power surge in the power supply system, leading to variations in pixel performance. FIG. 5 is an illustrative graph showing this effect relative to the global integration time period associated with a global shutter mode of operation.

As shown in FIG. 5, system current/power usage is plotted against time. At time t1 (e.g., marking a beginning of global integration time period T1), a global RST photodiode reset timing control signal may be asserted (e.g., timing control circuitry 42 in FIG. 3 may provide the global RST signal to row driver circuitry 40 in FIG. 3) to cause a global photodiode reset operation across pixel array 20 (FIG. 2). To bring about the global photodiode reset operation, driver circuitry 44 for each of the affected pixel rows may receive the global RST timing control signal and consequently assert control signal RST for those rows (e.g., used to activate transistors 52 of FIG. 4 in pixels 22 across array 20). The near-simultaneous toggling of control signals RST (e.g., from an OFF state to an ON state) for each of the pixel rows may cause current/power surge 70 shortly after time t1 (e.g., after a short corresponding delay of distributing global RST timing control signal to each driver circuitry 44).

Similarly, at time t2 (e.g., marking an end of global integration time period T1 or after global integration time period T1 from time t1), a global TX1 charge transfer timing control signal may be asserted (e.g., timing control circuitry 42 in FIG. 3 may provide the global TX1 timing control signal to row driver circuitry 40 in FIG. 3) to cause a global charge transfer operation across pixel array 20 (FIG. 2). To bring about the global charge transfer operation, driver circuitry 44 for each of the affected pixel rows may receive the global TX1 timing control signal and consequently assert control signal TX1 for those rows (e.g., used to activate transistors 66 of FIG. 4 in pixels 22 across array 20). The near-simultaneous toggling of control signals TX1 (e.g., from an OFF state to an ON state) for each of the pixel rows may cause current/power surge 72 shortly after time t2 (e.g., after a short corresponding delay of distributing global TX1 timing control signal to each driver circuitry 44).

Figure 6:
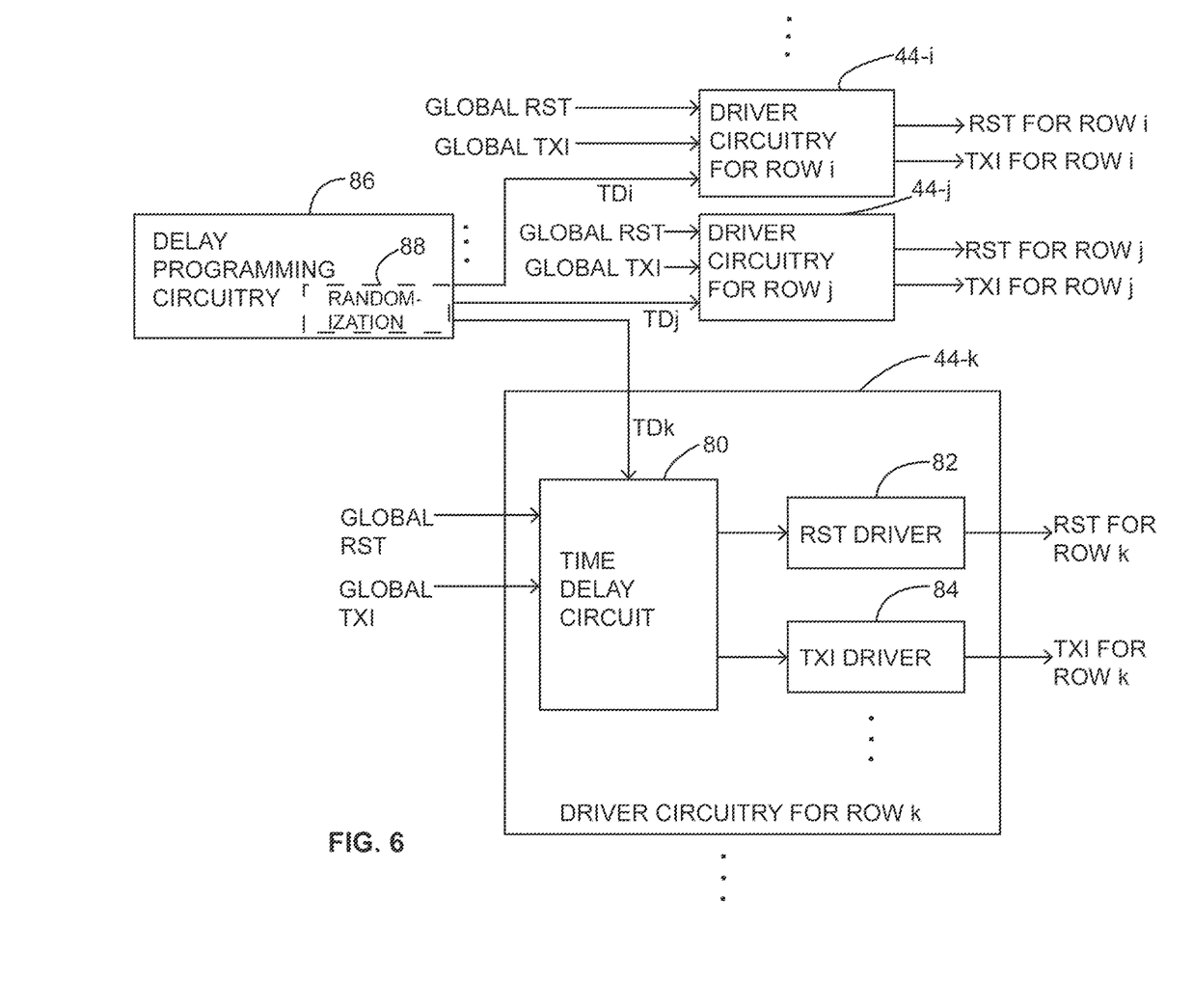
FIG. 6 is a diagram of illustrative driver circuitry having a time delay circuit in accordance with some embodiments.

To mitigate these issues, driver circuitry such as driver circuitry 44 (FIG. 3) for each pixel row may include time delay circuits provided with a programmable set of different delays. FIG. 6 is a diagram of illustrative driver circuitry for three different pixel rows each having time delay circuits coupled to delay programming circuitry.

As shown in FIG. 6, driver circuitry 44-k for pixel row k includes time delay circuit 80 (sometimes referred to herein simply as delay circuit 80), control signal RST driver circuit 82, and control signal TX1 driver circuit 84. If desired, driver circuitry 44-k may include any suitable number of control signal driver circuits for a corresponding number of control signals provided to pixels in row k. While not explicitly showing in FIG. 6, driver circuitry 44-i for row i, driver circuitry 44-j for row j, and any other driver circuitry 44 for any other pixel rows, may include analogous elements configured in an analogous manner to that shown and described for driver circuitry 44-k.

In the example of FIG. 6, each of driver circuitry may receive a global RST timing control signal and a global TX1 timing control signal (e.g., from timing control circuitry 42 along path 48 in FIG. 3, distributed within row driver circuitry 40 to each driver circuitry 44 in FIG. 3, etc.). Timing delay circuit 80 may receive these global timing control signals and may introduce a time delay $TD_k$ to these global timing control signals. In other words, an assertion in a global timing control signal, such as that for control signal RST or for control signal TX1, may be delayed by a time period (e.g., time $TD_k$).

Delayed versions of these global timing control signals may be provided to corresponding driver circuits (e.g., control signal RST driver circuit 82 or control signal TX1 driver circuit 84) to control these driver circuits to assert or deassert the corresponding control signals. As an illustrative example, when an assertion in the global RST timing control signal is received at time delay circuit 80, RST driver circuit 82 may receive the assertion in the global RST timing control signal after time $TD_k$ and use the assertion in the global RST timing control signal to pull the output control signal RST for row k up to an asserted or ON level (e.g., the global RST timing control signal may be provided to activate a pull-up circuit, transistor, or other active circuit). In this manner, the assertion of control signal RST for row k may be delayed by time $TD_k$. In a similar manner, a delayed deassertion in the global RST timing control signal may pull the output control signal RST for row k down to a deasserted or OFF level (e.g., the global RST timing control signal may be provided to a pull-down circuit, transistor, or other active circuit).

Driver circuitry 44-k may handle the global TX1 timing control signal and any other global timing control signals in a similar manner to that described in connection with the global RST timing control signal (e.g., timing delay circuit 80 delays the global TX1 timing control signal by time $TD_k$, and consequently, TX1 driver circuit 84 provides a delayed assertion or deassertion of control signal TX1 for row k in response to receiving the delayed global TX1 timing control signal). In particular, in order to preserve the same (global) integration time or other operational requirements, the same time delay $TD_k$ may be used for both global timing control signals for RST and TX1 (and for any other global timing control signals, if applicable).

In an analogous manner, driver circuitry for other rows such as driver circuitry 44-i and 44-j may also delay their input global timing control signals (e.g., for control signal RST and TX1). However, the time delay TD received by driver circuitry for different rows may be different. As an example, driver circuitry 44-i may receive time delay $TD_i$, which may be different from time delay $TD_j$ received by driver circuitry 44-j. One or both of these time delays $TD_i$ and $TD_j$ may be different from time delay $TD_k$ received by driver circuitry 44-k. In general, any number of different time delays may be provided to driver circuitry 44 for different rows. If desired, one or more driver circuitry 44 for different rows may share the same time delay.

As shown in FIG. 6, delay programming circuit 86 provides each of the time delays TD to the corresponding driver circuitry 44. Delay programming circuit 86 may provide the time delays TD to delay different global timing control signals in any suitable manner.

Configurations in which delay programming circuit 86 provide time delays for global timing control signals associated with a global shutter mode of operation (e.g., for a global photodiode reset timing or control signal RST, for a global photodiode charge transfer timing or control signal TX1) are described herein as illustrative examples.

In these examples, delay programming circuit 86 may identify a maximum time delay $TD_{max}$, above which driver circuitry 44 may be unable to satisfactorily operate the pixels in a global shutter mode of operation for a particular application (e.g., image artifacts similar to those in a rolling shutter mode of operation may be introduced). This (e.g., the identification and strict enforcement of a maximum time delay $TD_{max}$) may be particularly important for applications involving moving objects in the image scene to be captured. As illustrative examples, the maximum time delay $TD_{max}$ may be one percent of the integration time period T1, less than one percent of the integration time period T1, less than two percent of the integration time period T1, or any other suitable time.

Based on the maximum time delay $TD_{max}$, delay programming circuit 86 may identify a set of time delays TD that is associated with a (substantially) uniform distribution of time delays between a minimum time delay $TD_{min}$ (e.g., no time delay) and the maximum time delay $TD_{max}$, inclusive. The set of time delays may include time delays that increase by any suitable granularity (e.g., any step sizes between adjacent time delays).

If desired, each time delay generated by delay programming circuit 86 may be distributed to one or more driver circuitry 44 for one or more corresponding rows (e.g., time delays may be row-specific or may be shared between two or more rows). In general, time delays provided for different row may exhibit any suitable regular and/or predetermined pattern or may be randomized across the different rows. As an example, rows may be placed in different groups (e.g., based on their placements on the array), and driver circuitry 44 for rows in the same group may receive the same time delay. In this manner a repeating pattern of time delays across the array may be achieved.

In some illustrative configurations, delay programming circuitry 86 may include randomization circuit 88, which may be used to randomize the time delay received by each row. As an example, delay programming circuit 86 may generate a set of regularly spaced time delays satisfying the minimum and/or maximum time delay requirement, and randomization circuit 88 may randomly assign a time delay in the regularly spaced time delays to each driver circuitry 44. As another example, randomization circuit 88 may be used to generate a randomized or pseudo-randomized output useable directly to identify a corresponding time delay for a particular row. Time delays generated in this manner across all rows may represent a set of time delays having a uniform distribution while meeting minimum and maximum time delay requirements.

These examples are merely illustrative. If desired, delay programming circuitry 86 may provide any suitable time delay to each driver circuitry 44 for pixel rows such that a global event (associated with an assertion or deassertion of a global timing control signal) such as those for a global shutter mode of operation, occurs at ever slightly different times across the different driver circuitry 44. This may help ensure that only a relatively small subset of all driver circuitry 44 is drawing current from shared supply or ground lines at any given time. By organizing the slightly different times in a substantially uniform manner across the different times, the peak current/power drawn may be reduced and evenly distributed.

If desired, delay programming circuit 86 may provide different sets of time delays to each pixel row on a per-frame basis or after any suitable amount of time. This may help to remove any possibility of temporal artifacts.

Figure 7:
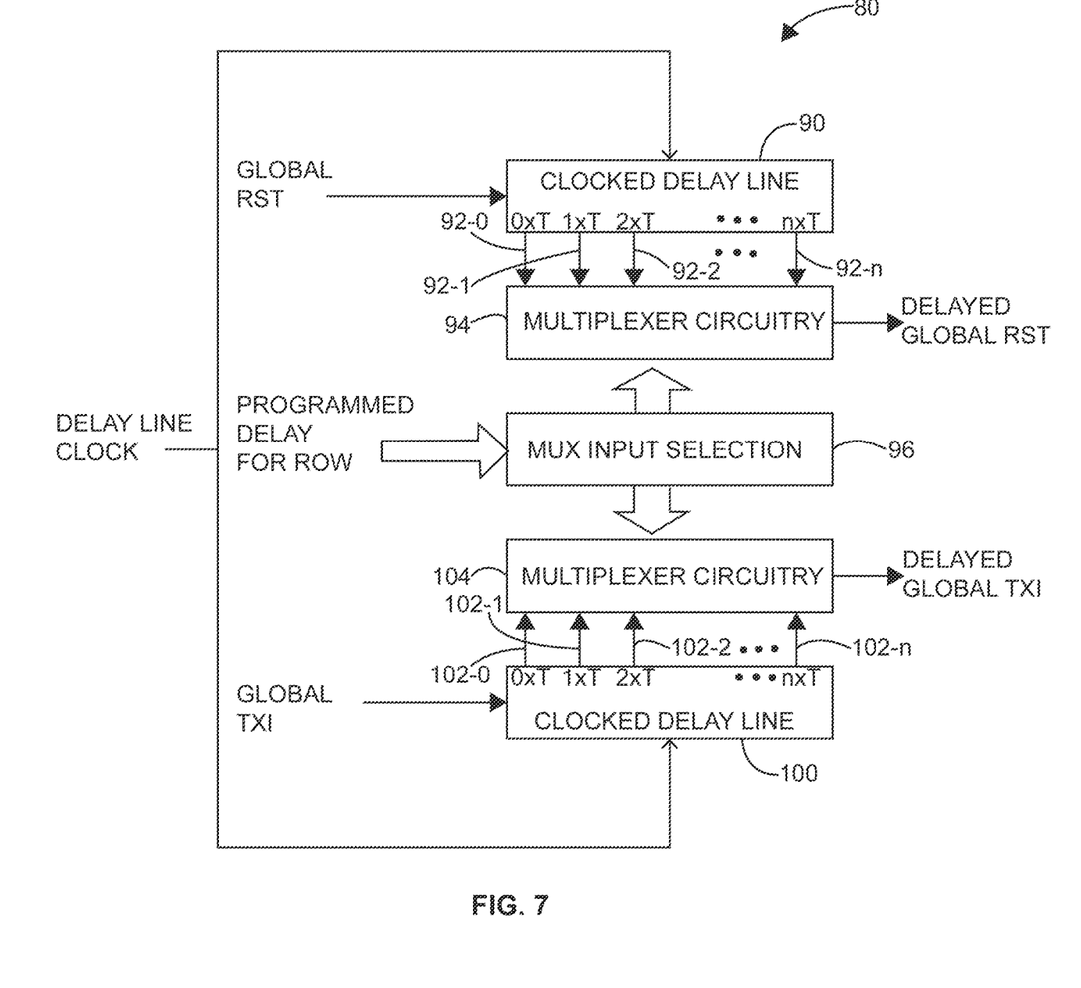
FIG. 7 is a diagram of an illustrative time delay circuit implemented using a clocked delay line in accordance with some embodiments.

FIG. 7 is a diagram of an illustrative time delay circuit that may be used to implement time delay circuit 80 in FIG. 6. As shown in FIG. 7, time delay circuit 80 includes (clocked) delay line 90 (e.g., a set of flip-flops) that receive a delay line clock signal having a period of T. Based on the delay line clock signal and an input global RST timing control signal, delay line 90 may generate a plurality of outputs 92, each corresponding to a global RST timing control signal delayed by a different integer multiple of time period T.

As examples, output 92-0 may be the original global RST timing control signal without no delay, output 92-1 may be the global RST timing control signal with one clock period T of delay, output 92-2 may be the global RST timing control signal with two clock periods T of delay, and analogously, output 92-$n$ may be the global RST timing control signal with n clock periods T of delay. Delay line 90 may be provide any suitable number of outputs 92 (e.g., may be a suitable length, may have suitable number of flip-flops, etc.).

In the example of FIG. 4, multiplexer circuitry 94 receives each of the outputs 92 as a corresponding input and selects one of the outputs 92 to pass as an output (e.g., a suitably delayed global RST timing control signal output). This output of multiplexer circuitry 94 may be provided to a control signal RST driver such as RST driver circuit 82 in FIG. 6.

In an analogous manner, time delay circuit 80 includes corresponding delay line 100 (e.g., clocked by the same delay line clock signal) and multiplexer circuitry 104 for generating a suitably delayed global TX1 timing control signal output from multiplexer circuitry 104. This output from multiplexer circuitry 104 may be provided to a control signal TX1 driver such as TX1 driver circuit 84 in FIG. 6.

To provide and select the same delay for the global RST and global RX1 timing control signals (e.g., and thereby preserve the same integration time period across rows), the same shared selection circuit 96 may provide a selection signal to both multiplexer circuitry 94 and multiplexer circuitry 104. As shown in in FIG. 7, multiplexer input selection circuitry 96 receives a programmed delay signal (e.g., from delay programming circuitry 86 in FIG. 6, indicative of time delay $TD_k$ for driver circuitry 44-$k$ or other time delays for other driver circuitry 44). The programmed delay signal may be indicative of which input of multiplexer circuitry 94 and which corresponding input of multiplexer circuitry 104 is to be pass to their corresponding outputs. As an illustrative example, the programmed delay signal may correspond with time delay $TD_k$ (FIG. 6), which is associated with one clock period T of delay. Accordingly, multiplexer input selection circuit 96 may select delay line output 92-1 as the output of multiplexer circuitry 94 and may select delay line output 102-1 (with the same clock period delay as output 92-1) as the output of multiplexer circuitry 104. In such a manner, the same delay may be used for control signals RST and TX1 controlling the same pixel row.

The configuration of time delay circuit 80 in FIG. 7 is merely illustrative. If desired, other suitable types of time delay circuits such as those based on analog ramping or un-clocked delay lines may be used.

Figure 8:
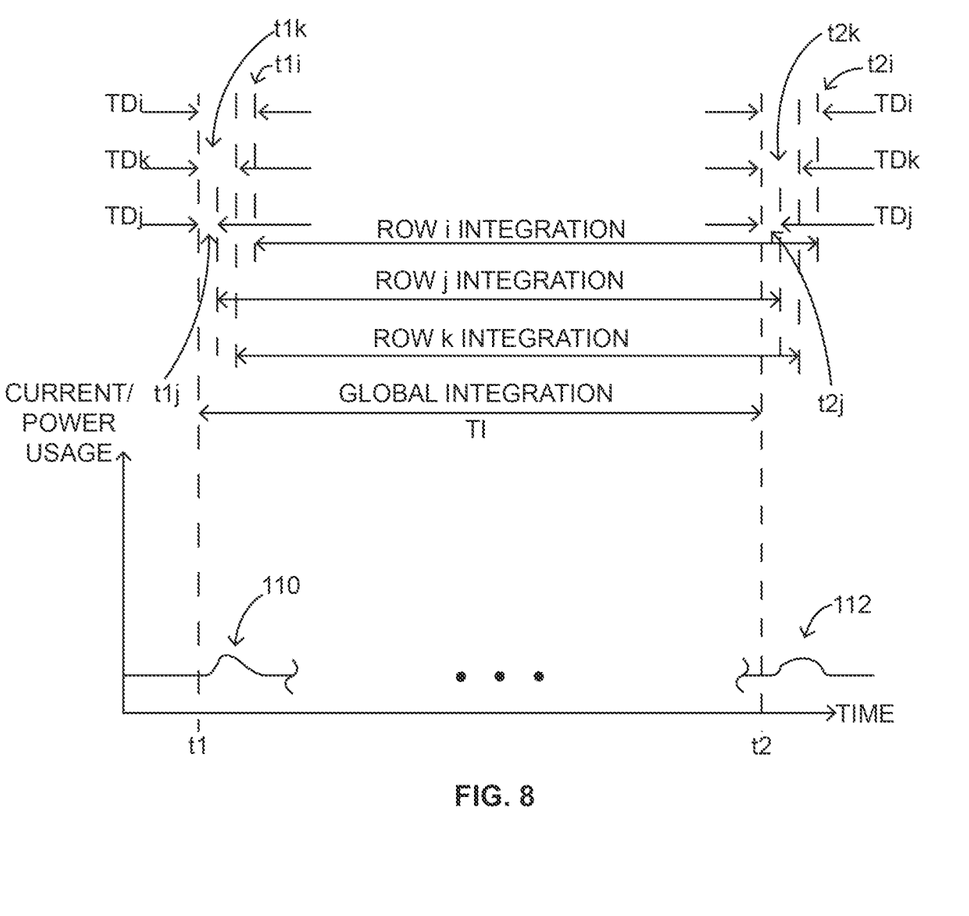
FIG. 8 is an illustrative graph showing power usage with respect to differently delayed row integration time periods in accordance with some embodiments.

FIG. 8 is an illustrative graph showing the effects of offsetting (e.g., misaligning) or dithering global events (e.g., the global photodiode reset event, the global photodiode charge transfer event, etc.) associated with a global shutter mode of operation and enabled by the row control circuitry described in connection with FIGS. 6 and 7.

As shown in FIG. 8, system current/power usage is plotted against time. Compared to FIG. 5, the global timing control signals for RST and TX1 (e.g., the assertion of these global timing control signals) defining the global integration time period may still occur at time t1 and t2, respectively. However, the actual integration time during which photodiodes in pixels generate charge may be shifted depending on the row in which the pixels are disposed, thereby leading to offset integration times between some of the rows (e.g., offset integration time periods for row i, row j, row k, etc.).

In particular, for pixels in row k, the global photodiode reset event (e.g., corresponding to the assertion of control signal RST for pixels in row k) may occur at time $t1_k$ (delayed from time t1 by time delay $TD_k$). For pixels in row j, the global photodiode reset event (e.g., corresponding to the assertion of control signal RST for pixels in row j) may occur at time $t1_j$ (delayed from time t1 by time delay $TD_j$). For pixels in row i, the global photodiode reset event (e.g., corresponding to the assertion of control signal RST for pixels in row i) may occur at time $t1_i$ (delayed from time t1 by time delay $TD_i$).

Similarly, for pixels in row k, the global photodiode charge transfer event (e.g., corresponding to the assertion of control signal TX1 for pixels in row k) may occur at time $t2_k$ (delayed from time t2 by time delay $TD_k$). For pixels in row j, the global photodiode charge transfer event (e.g., corresponding to the assertion of control signal TX1 for pixels in row j) may occur at time $t2_j$ (delayed from time t2 by time delay $TD_j$). For pixels in row i, the global photodiode charge transfer event (e.g., corresponding to the assertion of control signal TX1 for pixels in row i) may occur at time $t2_i$ (delayed from time t2 by time delay $TD_i$).

By providing the same delays to the beginnings and ends of the integration time period for each row, the integration times across pixels in different rows remain the same. By providing different delays to global events for these three pixel rows and any additional pixel rows, the system may can exhibit reduced current/power surges 110 and 112 (e.g., relative to those in FIG. 5). Furthermore, if randomized delays are provided to different pixel rows, this may also help remove any systematic artifacts associated with variably delaying the global events (e.g., the global photodiode reset event).

Various embodiments have been described illustrating systems and methods for mitigating global event power surges in image sensors.

As an example, an image sensor may include an image sensor pixel array and row control circuitry coupled to the image sensor pixel array. The row control circuitry may include a first control signal driver circuit coupled to a pixel row, a second control signal driver circuit coupled to the pixel row, timing control circuitry coupled to the first and second control signal driver circuits, and a time delay circuit coupled between the first control signal driver circuit and the timing control circuitry and coupled between the second control signal driver circuit and the timing control circuitry. In particular, the first control signal driver circuit may be configured to provide a first control signal to the pixel row, and the second control signal driver circuitry may be configured to provide a second control signal to the pixel row. The timing control circuitry may be configured to provide one or more global timing control signals (e.g., global photodiode reset timing control signals associated with the first control signal, global photodiode charge transfer timing control signals associated with the second signal). The time delay circuit may be configured to receive the one or more global timing control signals and to provide a delayed version (e.g., using the same delay) of the one or more global timing control signals to the corresponding one of the first or second control signal driver circuits.

If desired, the time delay circuit may include a clocked delay line that generates a plurality of outputs associated with a respective plurality of time delays, and multiplexer circuitry coupled to the clocked delay line and configured to provide the delayed version of the one or more global timing control signals to the control signal driver circuit by passing one of the plurality of outputs.

The row control circuitry may include delay programming circuitry coupled to the time delay circuit associated with the pixel row and additional time delay circuits associated with additional pixel rows. The delay programming circuitry may be configured to provide signals indicative of different time delays to each of the time delay circuits. If desired, the delay programming circuitry may be configured to supply time delays as part of a regular pattern across the different pixel rows or in a randomized manner to the time delay circuits.

If desired, the row control circuitry may include a third control signal driver circuit coupled to an additional pixel row, and the additional time delay circuit may be coupled between the third control signal driver circuit and the timing control circuitry. If desired, the first and third control signal driver circuits may be configured to provide photodiode reset control signals to the pixel row and the additional pixel row. If desired, the timing control circuitry may be configured to provide a global timing control signal, the time delay circuit may be configured to provide a first version of the global timing control signal delayed by a first time delay to the first control signal driver circuit, and the additional time delay circuit may be configured to provide a second version of the global timing control signal delayed by a second time delay.

The image sensor pixel array may include pixels operable in a global shutter mode operation. If desired, the first control signal driver circuit may be configured to provide a photodiode reset signal to the pixel row, and the second control signal driver circuit may be configured to provide a photodiode charge transfer signal to the pixel row. If desired, the timing control circuitry may be configured to provide a global photodiode reset timing control signal, and the time delay circuit may be configured to provide a version of the global photodiode reset timing control signal delayed by a time period to the first control signal driver circuit. If desired, the timing control circuitry may be configured to provide a global photodiode charge transfer timing control signal, and the time delay circuit may be configured to provide a version of the global photodiode charge transfer timing control signal delayed by the same time period to the second control signal driver circuit.

The foregoing is merely illustrative of the principles of this invention and various modifications can be made by those skilled in the art without departing from the scope and spirit of the invention. The foregoing embodiments may be implemented individually or in any combination.

What is claimed is:

1. An image sensor comprising:
an image sensor pixel array; and
row control circuitry coupled to the image sensor pixel array, the row control circuitry including:
a first control signal driver circuit coupled to a pixel row in the image sensor pixel array;
a second control signal driver circuit coupled to the pixel row;
timing control circuitry coupled to the first and second control signal driver circuits; and
a time delay circuit coupled between the first control signal driver circuit and the timing control circuitry and coupled between the second control signal driver circuit and the timing control circuitry, wherein the time delay circuit receives a global timing control signal as a first input and a clock signal as a second input and outputs a delayed version of the global timing control signal by introducing a time delay to the global timing control signal and wherein the first control signal driver circuit receives the delayed version of the global timing control signal.

2. The image sensor defined in claim 1, wherein the row control circuitry includes delay programming circuitry coupled to the time delay circuit.

3. The image sensor defined in claim 2, wherein the time delay circuit is associated with the pixel row, and the row control circuitry includes an additional time delay circuit associated with an additional pixel row in the image sensor pixel array and coupled to the delay programming circuitry.

4. The image sensor defined in claim 3, wherein the row control circuitry includes a third control signal driver circuit coupled to the additional pixel row, and the additional time delay circuit is coupled between the third control signal driver circuit and the timing control circuitry.

5. The image sensor defined in claim 4, wherein the first and third control signal driver circuits are configured to provide photodiode reset control signals to the pixel row and the additional pixel row.

6. The image sensor defined in claim 5, wherein the delay programming circuitry provides an indication for the time delay to the time delay circuit and provides an indication for an additional time delay to the additional time delay circuit.

7. The image sensor defined in claim 6, wherein the timing control circuitry is configured to provide the global timing control signal, the time delay circuit is configured to provide the delayed version of the global timing control signal delayed by the time delay to the first control signal driver circuit, and the additional time delay circuit is configured to provide a second version of the global timing control signal delayed by the additional time delay.

8. The image sensor defined in claim 1, wherein the image sensor pixel array comprises pixels operable in a global shutter mode operation.

9. The image sensor defined in claim 1, wherein the first control signal driver circuit is configured to provide a photodiode reset signal to the pixel row, and the second control signal driver circuit is configured to provide a photodiode charge transfer signal to the pixel row.

10. The image sensor defined in claim 1, wherein the global timing control signal is a global photodiode reset timing control signal.

11. The image sensor defined in claim 1, wherein the global timing control signal is a global photodiode charge transfer timing control signal.

12. An image sensor comprising:
an image sensor pixel array; and
row control circuitry coupled to the image sensor pixel array and configured to operate pixels in the image sensor pixel array in a global shutter mode of operation, the row control circuitry including:
delay programming circuitry;
first row driver circuitry coupled to a first pixel row in the image sensor pixel array and having a first delay circuit coupled to the delay programming circuitry, wherein the first row driver circuitry is configured to operate the first pixel row with a first global integration time period;
second row driver circuitry coupled to a second pixel row in the image sensor pixel array and having a second delay circuit coupled to the delay programming circuitry, wherein the second row driver circuitry is configured to operate the second pixel row with a second global integration time period that temporally overlaps and is temporally offset from the first global integration time period and wherein the first and second global integration time periods have a same time duration; and
timing control circuitry coupled to the first row driver circuitry and the second row driver circuitry.

13. The image sensor defined in claim 12, wherein timing control circuitry is configured to provide a global timing control signal associated with the global shutter mode of operation to the first row driver circuitry and to the second row driver circuitry.

14. The image sensor defined in claim 13, wherein the delay programing circuitry provides a first signal indicative of a first time delay to the first delay circuit and provides a second signal indicative of a second time delay to the second delay circuit.

15. The image sensor defined in claim 14, wherein the first delay circuit is configured to delay the global timing control signal by the first time delay, and the second delay circuit is configured to delay the global timing control signal by the second time delay.

16. The image sensor defined in claim 12, wherein the delay programming circuitry is configured to supply the first and second delay circuits respectively with first and second time delays as part of a regular pattern.

17. The image sensor defined in claim 12, wherein the delay programming circuitry is configured to supply the first and second delay circuits respectively with first and second time delays in a randomized manner.

18. An image sensor comprising:
an image sensor pixel array; and
row control circuitry coupled to the image sensor pixel array, the row control circuitry including:
a control signal driver circuit configured to provide a control signal to a pixel row in the image sensor pixel array;
timing control circuitry configured to provide a global timing control signal; and
a time delay circuit configured to receive the global timing control signal and to provide a delayed version of the global timing control signal to the control signal driver circuit, wherein the time delay circuit includes:
a clocked delay line that generates a plurality of outputs associated with a respective plurality of time delays, and
multiplexer circuitry coupled to the clocked delay line and configured to provide the delayed version of the global timing control signal to the control signal driver circuit by passing one of the plurality of outputs.

19. The image sensor defined in claim 1, wherein a duration of the time delay is dependent upon a property of the clock signal.

20. The image sensor defined in claim 12, wherein the second global integration time period is temporally offset from the first global integration time period by an offset time delay less than two percent of the time duration.

* * * * *